(12) United States Patent
Kaslusky et al.

(10) Patent No.: US 10,103,089 B2
(45) Date of Patent: Oct. 16, 2018

(54) HEAT TRANSFER DEVICE WITH FINS DEFINING AIR FLOW CHANNELS

(75) Inventors: Scott F. Kaslusky, West Hartford, CT (US); Brian St. Rock, Andover, CT (US); John H. Whiton, South Windsor, CT (US); Vincent C. Nardone, South Windsor, CT (US)

(73) Assignee: Hamilton Sundstrand Corporation, Charlotte, NC (US)

(*) Notice: Subject to any disclaimer, the term of this patent is extended or adjusted under 35 U.S.C. 154(b) by 1795 days.

(21) Appl. No.: 12/732,320

(22) Filed: Mar. 26, 2010

(65) Prior Publication Data

US 2011/0232885 A1  Sep. 29, 2011

(51) Int. Cl.
*F28F 7/00* (2006.01)
*H01L 23/467* (2006.01)
*H01L 23/367* (2006.01)

(52) U.S. Cl.
CPC ........ *H01L 23/467* (2013.01); *H01L 23/3672* (2013.01); *H01L 2924/0002* (2013.01)

(58) Field of Classification Search
USPC ................. 165/80.2, 80.3, 104.33, 121, 185; 361/697, 704
See application file for complete search history.

(56) References Cited

U.S. PATENT DOCUMENTS

| | | |
|---|---|---|
| 3,592,260 A | 7/1971 | Berger |
| 4,838,041 A | 6/1989 | Bellows et al. |
| 5,132,780 A | 7/1992 | Higgins, III |
| 5,294,831 A * | 3/1994 | Azar et al. ............ 257/722 |
| 5,597,034 A * | 1/1997 | Barker et al. ........... 165/80.3 |
| 5,661,638 A * | 8/1997 | Mira .................... H01L 23/467 165/126 |
| 5,704,417 A | 1/1998 | Christensen et al. |
| 5,854,739 A | 12/1998 | Steiner et al. |
| 5,867,365 A | 2/1999 | Chiou |
| 5,927,385 A | 7/1999 | Yeh |
| 5,943,209 A | 8/1999 | Liu |
| 5,957,659 A | 9/1999 | Amou et al. |
| 6,014,008 A * | 1/2000 | Hartzell et al. ............ 320/106 |
| 6,015,008 A * | 1/2000 | Kogure et al. ............ 165/185 |
| 6,130,818 A | 10/2000 | Severson |
| 6,134,108 A | 10/2000 | Patel et al. |
| 6,161,610 A * | 12/2000 | Azar ......................... 165/80.3 |
| 6,170,563 B1 | 1/2001 | Hsieh |

(Continued)

FOREIGN PATENT DOCUMENTS

| | | |
|---|---|---|
| EP | 1253638 A2 | 10/2002 |
| EP | 1526570 A2 | 4/2005 |

(Continued)

OTHER PUBLICATIONS

Extended European Search Report dated Nov. 29, 2012 for EP Application No. 11250380.0.

*Primary Examiner* — Claire Rojohn, III
(74) *Attorney, Agent, or Firm* — Carolson, Gaskey & Olds, P.C.

(57) ABSTRACT

An exemplary cooling system includes a heat transfer device having a base and a plurality of curved fins defining a curved air flow channel. Air flow is provided through the air flow channel, and a plurality of openings through a fin communicate air flow from a first side to a second side of the curved fin.

32 Claims, 6 Drawing Sheets

(56) References Cited

U.S. PATENT DOCUMENTS

| | | | |
|---|---|---|---|
| 6,179,046 B1 * | 1/2001 | Hwang | H01L 23/467 165/121 |
| 6,196,300 B1 | 3/2001 | Checchetti | |
| 6,199,624 B1 | 3/2001 | Wotring | |
| 6,244,331 B1 * | 6/2001 | Budelman | F28F 3/022 165/121 |
| 6,313,399 B1 | 11/2001 | Suntio et al. | |
| 6,371,200 B1 * | 4/2002 | Eaton | C06B 25/02 165/104.33 |
| 6,419,007 B1 | 7/2002 | Ogawara et al. | |
| 6,446,707 B1 * | 9/2002 | White | H01L 23/367 165/121 |
| 6,479,895 B1 | 11/2002 | Lee et al. | |
| 6,505,680 B1 | 1/2003 | Hegde | |
| 6,525,939 B2 | 2/2003 | Liang et al. | |
| 6,535,385 B2 | 3/2003 | Lee | |
| 6,538,892 B2 | 3/2003 | Smalc | |
| 6,543,522 B1 | 4/2003 | Hegde | |
| 6,587,341 B1 | 7/2003 | Wei | |
| 6,633,484 B1 | 10/2003 | Lee et al. | |
| 6,657,862 B2 | 12/2003 | Crocker et al. | |
| 6,659,169 B1 * | 12/2003 | Lopatinsky et al. | 165/121 |
| 6,664,673 B2 * | 12/2003 | Lopatinsky | F04D 25/0653 257/E23.099 |
| 6,668,915 B1 * | 12/2003 | Materna | 165/146 |
| 6,671,172 B2 | 12/2003 | Carter et al. | |
| 6,675,881 B1 | 1/2004 | Rago | |
| 6,714,415 B1 * | 3/2004 | Shah | H01L 23/467 165/185 |
| 6,755,242 B2 | 6/2004 | White | |
| 6,886,627 B2 | 5/2005 | Kozyra et al. | |
| 7,120,020 B2 | 10/2006 | Carter et al. | |
| 7,156,620 B2 | 1/2007 | Papple | |
| 7,188,418 B2 | 3/2007 | Shah | |
| 7,193,849 B2 | 3/2007 | Xu et al. | |
| 7,200,934 B2 | 4/2007 | Carter et al. | |
| 7,311,137 B2 * | 12/2007 | Thors et al. | 165/133 |
| 7,331,380 B2 * | 2/2008 | Ghosh | H01L 23/473 165/104.33 |
| 7,361,081 B2 | 4/2008 | Beitelmal et al. | |
| 7,467,467 B2 | 12/2008 | Prociw | |
| 7,753,106 B2 * | 7/2010 | Lin et al. | 165/80.3 |
| 7,760,506 B1 | 7/2010 | Wang et al. | |
| 7,814,967 B2 | 10/2010 | Harman | |
| 7,896,611 B2 * | 3/2011 | Khanna et al. | 415/177 |
| 7,911,790 B2 | 3/2011 | Carter et al. | |
| 2002/0100577 A1 | 8/2002 | Wagner | |
| 2002/0139515 A1 * | 10/2002 | Azar | 165/80.3 |
| 2002/0144809 A1 * | 10/2002 | Siu | 165/185 |
| 2002/0171139 A1 | 11/2002 | Lee et al. | |
| 2002/0179290 A1 * | 12/2002 | Larson | 165/104.33 |
| 2003/0046967 A1 | 3/2003 | Pollard, II et al. | |
| 2003/0136545 A1 * | 7/2003 | Lin et al. | 165/80.3 |
| 2004/0011508 A1 * | 1/2004 | Tan | H01L 23/467 165/80.3 |
| 2004/0244947 A1 | 12/2004 | Chen | |
| 2005/0252639 A1 | 11/2005 | Lin | |
| 2005/0252640 A1 | 11/2005 | Chang | |
| 2006/0011324 A1 | 1/2006 | Rogers et al. | |
| 2006/0021735 A1 | 2/2006 | Lopatinsky et al. | |
| 2006/0042777 A1 | 3/2006 | Delano et al. | |
| 2006/0185820 A1 * | 8/2006 | Chen | H01L 23/3672 165/80.3 |
| 2006/0187642 A1 | 8/2006 | Jeong | |
| 2007/0204972 A1 * | 9/2007 | Edward et al. | 165/80.3 |
| 2008/0080137 A1 * | 4/2008 | Otsuki | H01L 23/3672 361/697 |
| 2008/0142194 A1 * | 6/2008 | Zhou | F28D 1/0472 165/80.3 |
| 2008/0202502 A1 * | 8/2008 | Eckhardt | 126/92 AC |
| 2009/0050303 A1 * | 2/2009 | Komori et al. | 165/151 |
| 2009/0263232 A1 * | 10/2009 | Jarrah | F04D 25/0613 415/4.4 |

FOREIGN PATENT DOCUMENTS

| | | |
|---|---|---|
| EP | 0892431 B1 | 9/2009 |
| GB | 2377321 A | 1/2003 |
| WO | 02/093643 A1 | 11/2002 |

* cited by examiner

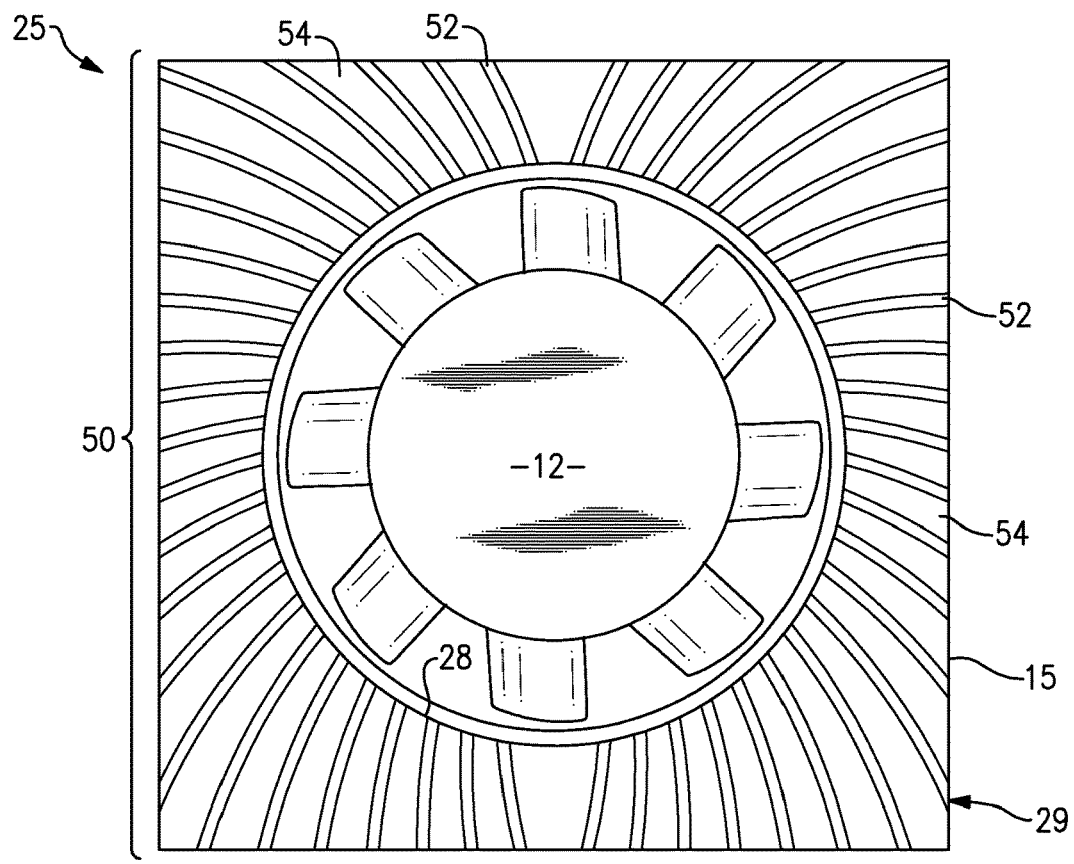
FIG.3
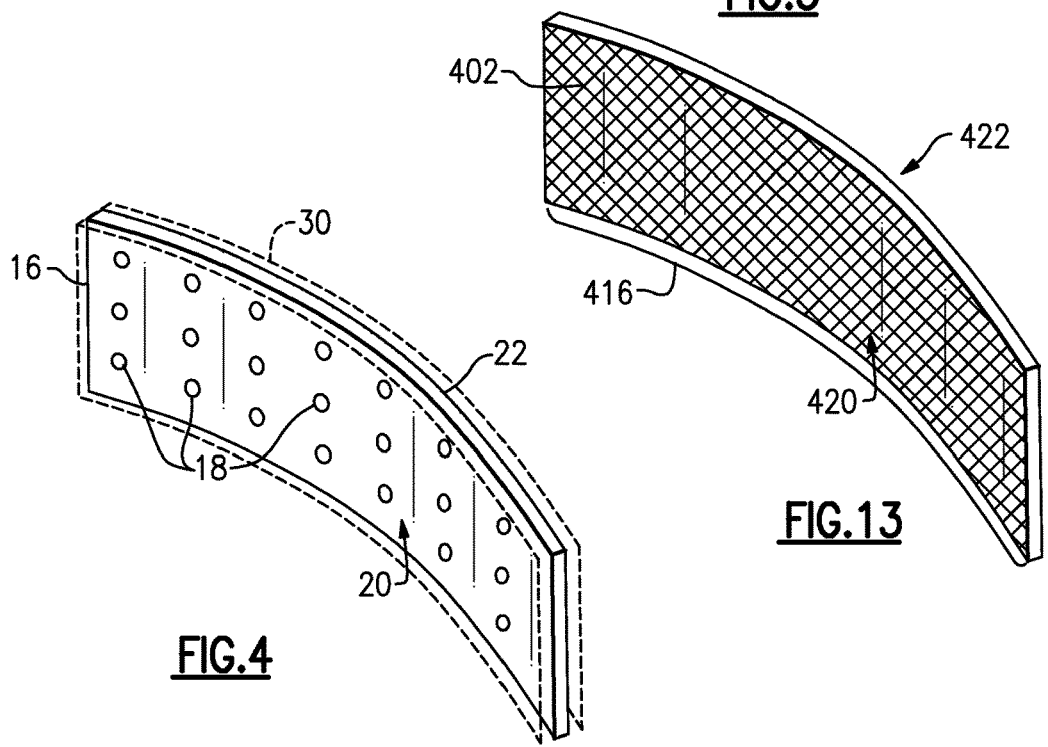
FIG.13
FIG.4

HEAT TRANSFER DEVICE WITH FINS DEFINING AIR FLOW CHANNELS

BACKGROUND

This disclosure generally relates a high performance cooling system. More particularly, this disclosure relates to a cooling system including curved heat sinks fins.

A cooling system is typically utilized to control a temperature of heat producing components, such as high performance electronic components. Known cooling systems typically include thermally conductive heat transfer devices including a plurality of fins. The cooling system is positioned in thermal contact with the heat producing component to remove the heat and control temperature. The heat transfer device is typically further cooled by air flow directed over and through the heat transfer device fins.

SUMMARY

An exemplary cooling system includes a heat transfer device having a base and a plurality of curved fins defining a curved air flow channel. Air flow is provided through the air flow channel, and a plurality of openings through a fin communicate air flow from a first side to a second side of the curved fin.

An exemplary heat transfer device includes a base and a plurality of curved fins. The plurality of curved fins define curved air flow channels and have a plurality of openings allowing communication of air flow from a high pressure side to a low pressure side to disrupt air flow in the corresponding channel.

An exemplary heat transfer device includes a plurality of fins defining a corresponding plurality of air flow channels. Each of the plurality of fins has a plurality of openings for communicating air flow from a first side to a second side to disrupt air flow through the corresponding air flow channel. There is also a plurality of protrusions on the fin extending at least partially into the air flow channel.

An exemplary method for cooling a heat producing device is disclosed. A plurality of curved fins is adapted to absorb heat from a source. Air flow is then directed through curved channels defined between the plurality of curved fins. Air flow is communicated through the plurality of curved fins into an adjacent curved channel to disrupt air flow through the adjacent curved channel.

These and other features of the disclosed example can be best understood from the following specification and drawings, the following of which is a brief description.

BRIEF DESCRIPTION OF THE DRAWINGS

FIG. 3 is a partial sectional view of another example cooling system with air flow source and radial heat sink.

FIG. 4 is a side view of a curved fin with a plurality of openings.

FIG. 13 is a sectional view of a curved porous fin.

DETAILED DESCRIPTION

Figure 1:
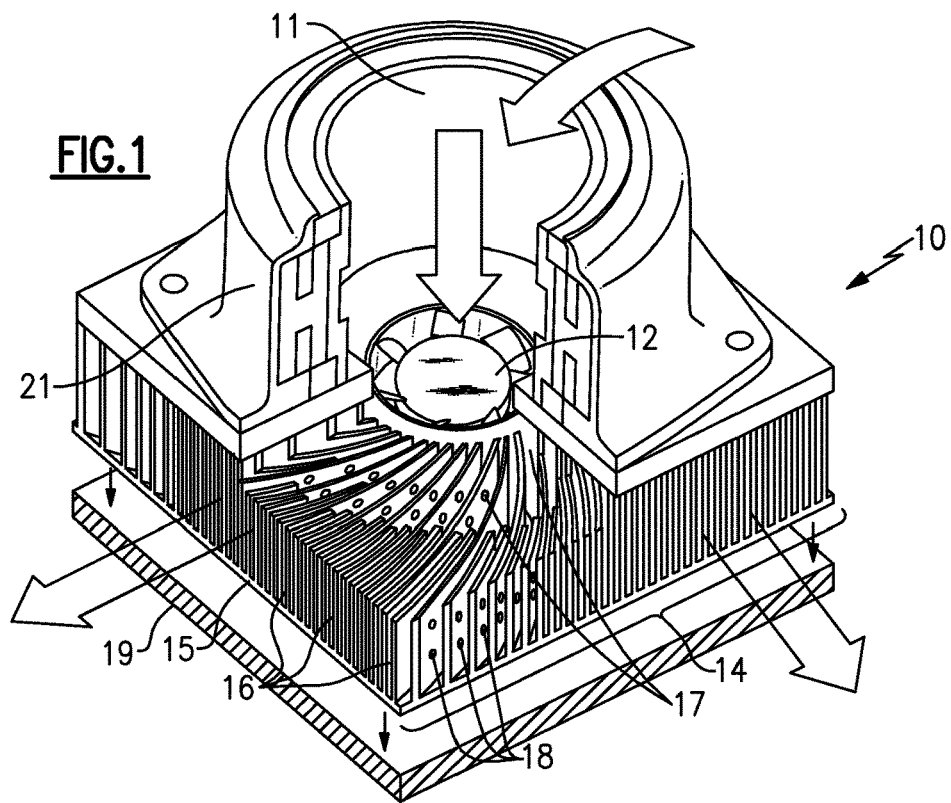
FIG. 1 is a partial sectional view of an example cooling system including an air flow source and a heat transfer device.

Referring to FIG. 1, an example cooling system 10 includes a heat transfer device. As shown in FIG. 1, the heat transfer device is a heat sink 14 placed in thermal contact with a heat producing device 19. However, other known heat transfer devices are within the contemplation of this disclosure. In this example, the heat producing device 19 is an electronic device; however, this disclosure may benefit other heat producing devices. The heat sink 14 includes a base 15 and a plurality of curved fins 16. The plurality of curved fins 16 define curved air flow channels 17. A motor 21 is attached to the heat sink 14 and powers a fan 12 mounted to a central area 11 of the base 15. Air is pulled down through the motor 21 by the fan 12 and sent through the curved channels 17. Alternatively, air is pulled through the heat sink by other known devices. Heat produced by the heat producing device 19 is transferred to the base 15 and plurality of fins 16. The air flow through the curved channels 17 against the plurality of curved fins 16 and the base 15 carries away heat. The example curved fins 16 include openings 18 which allow communication of air flow through the curved fins 16 between adjacent curved channels 17. The air driven through the curved fins 16 disrupts a boundary layer of airflow to increase cooling capacity of the example cooling system 10. Examples of the heat producing device 19 with which the cooling system 10 can be used include, but are not limited to, microprocessors, car conversion electronics, power switches, and telecommunications equipment.

Figure 2A:
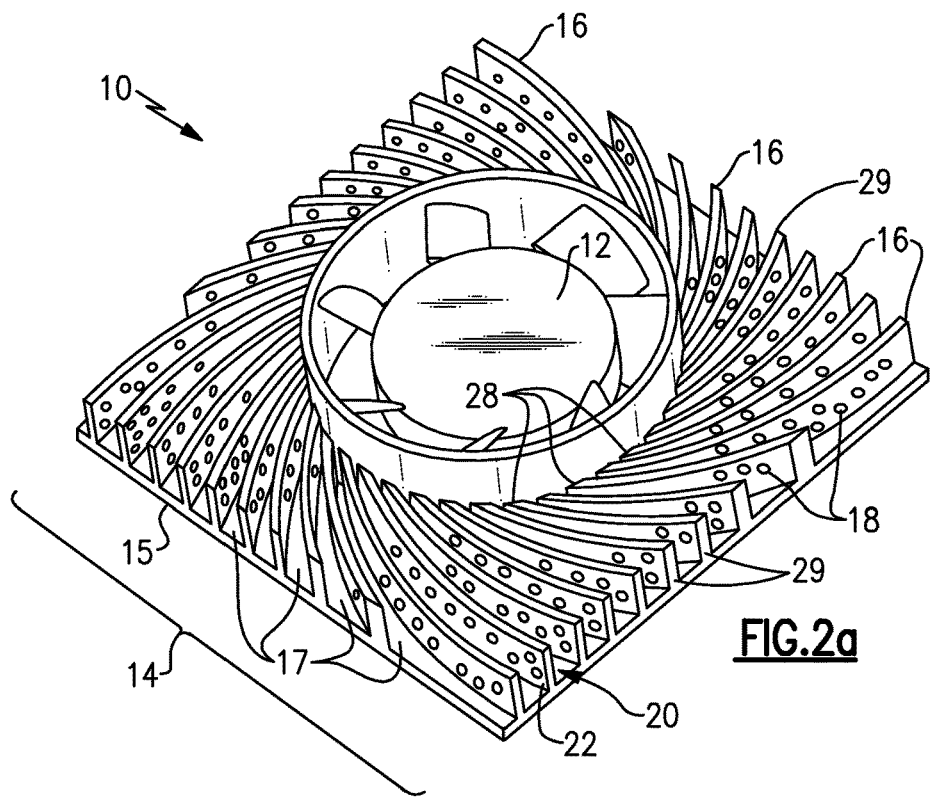
FIG. 2a is a partial sectional view of the example cooling system with air flow source and radial heat sink.

Referring to FIG. 2a, an example air flow source is fan 12. However, other known devices are within the contemplation of this disclosure. The example cooling system 10 include a heat sink 14 with the base 15 and an inner housing 28 for the fan 12. The heat sink 14 is a radial heat sink. The curved fins 16 originate at the inner housing 28 of the heat sink 14 and extend in a curved direction to the outer side 29 of the heat sink 14 forming the curved air flow channels 17. Each of the curved air flow channels 17 are defined by opposing sides of two curved fins 16 correspondingly curved. The curved channels 17 follow a non-linear path between the interior housing 28 and outer side 29 of the heat sink 14. Due to the shape of the curved fins 16, each of the curved fins 16 include a high pressure side 20 and a low pressure side 22 creating a pressure gradient across the curved fins 16. The openings 18 of the curved fins 16 communicate air between the high pressure side 20 and the low pressure side 22 of the curved fin 16. The curved fins 16 can be made of copper, aluminum, or other known thermally conductive material.

Figure 2B:
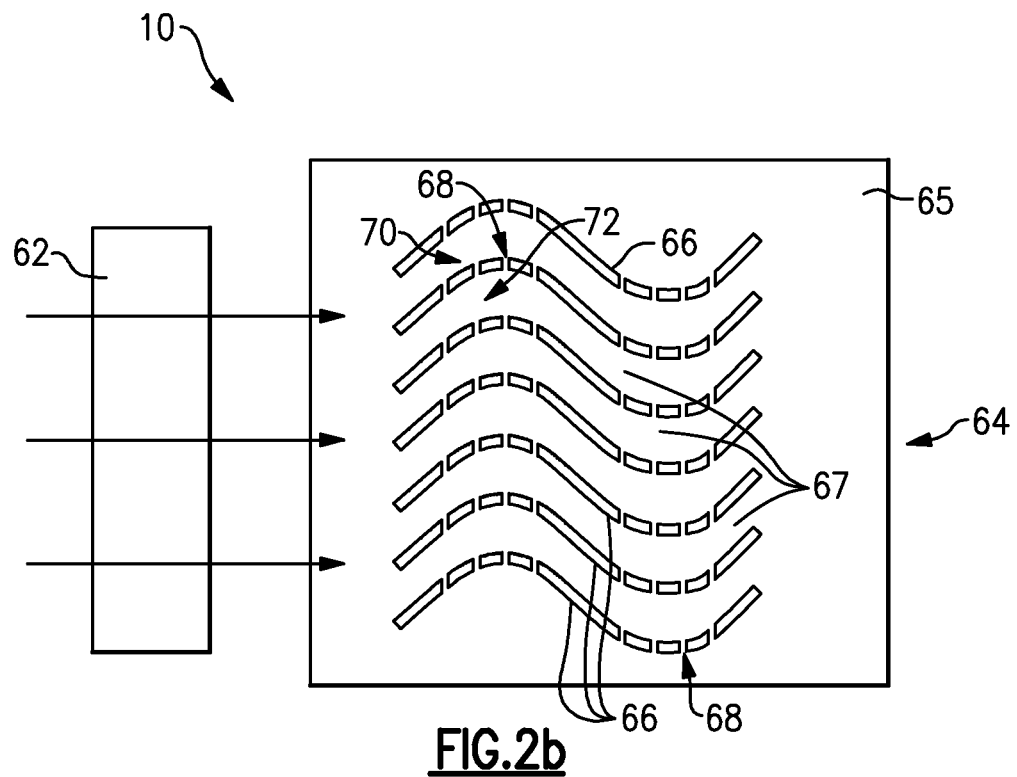
FIG. 2b is a partial schematic view of the example cooling system with air flow source and a linear heat sink.

Referring to FIG. 2b, an example air flow source is a fan 62. The example cooling system 10 includes a linear heat sink 64. The linear heat sink 64 includes fins 66 that extend across the base 65 such that the ends of the adjacent curved channels 67 are linearly aligned. Therefore, the curved fins 66 are aligned in a generally parallel manner across the base 65. The fan 62 provides linear air flow through the curved fins 66 of the linear heat sink 64. Each of the curved air flow channels 67 are defined by opposing sides of two curved fins 66 correspondingly curved. Due to the shape of the curved fins 66, each of the curved fins 66 include a high pressure side 70 and a low pressure side 72 creating a pressure gradient across the curved fins 66. The openings 68 of the curved fins 66 communicate air between the high pressure side 70 and the low pressure side 72 of the curved fin 66.

Referring to FIG. 3, with continued reference to FIG. 2a, another example system 25 includes a fan 12 and a heat sink 50 with a base 15 and inner housing 28 for the fan 12. The curved fins 52 originate at the inner housing 28 and extend in a curved direction to the outer side 29 of the heat sink 50 forming curved air flow channels 54. Due to the shape of the curved fins 52, each of the curved fins 52 include a high pressure side 20 which is convexly shaped and a low pressure side 22 which is concavely shaped creating a pressure gradient across the curved fins 52. Neither the curved fins 52 nor the curved channels 54 are uniformly curved. The curved fins 52 instead curve in opposite directions such that the convex high pressure sides 20 of at least two curved fins 52 and the concave low pressure sides 22 of at least two curved fins 52 face each other.

Referring to FIG. 4, with continued reference to FIG. 2a, the shape of the curved fins 16 creates a pressure gradient across the curved fins 16, resulting in the high pressure side 20 and the low pressure side 22. The high pressure side 20 is the convex side of the curved fins 16 while the low pressure side 22 is the concave side of the curved fins 16.

The example openings are holes 18. The holes 18 in the curved fins 16 provide for air flow between the high pressure side 20 and the low pressure side 22. The holes 18, can be arranged an equal distance apart, or alternatively, in any manner which aides the cooling of the particular cooling system 10. The flow of air around the curved fins 16 includes a boundary layer 30, which has an increased temperature due to its close proximity to the heat from the curved fins 16.

Figure 5:
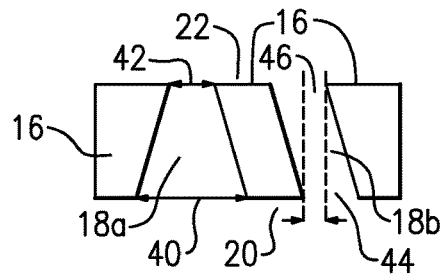
FIG. 5 is a sectional view of tapered and offset openings through a curved fin.

Referring to FIG. 5, the example openings are holes 18 in the curved fins 16 that are altered to aide air flow between the high pressure side 20 and low pressure side 22. The holes 18 can be drilled into the curved fins 16 at angles, or added by other known means. In one example, a hole 18a is tapered through the fin 16. When the holes 18a are tapered into the fin 16, the hole 18a has a larger first diameter 40 on the high pressure side 20 and a smaller second diameter 42 on the low pressure side 22. The difference in diameters induces increased air flow through the hole 18a between the high pressure side 20 and low pressure side 22.

In another example, holes 18b are offset across the fin 16. When the holes 18 are offset across the fin 16, a first opening 44 is offset from a second opening 46, effectively creating an angle relative to the curved fin 16. Offsetting the first opening 44 and second opening 46 increases air flow from the high pressure side 20 to the low pressure side 22. Alternatively, the holes 18 may be altered in any manner which aides airflow from a high pressure side 20 of the curved fin 16 to a low pressure side 22 of a curved fins 16.

Figure 6:
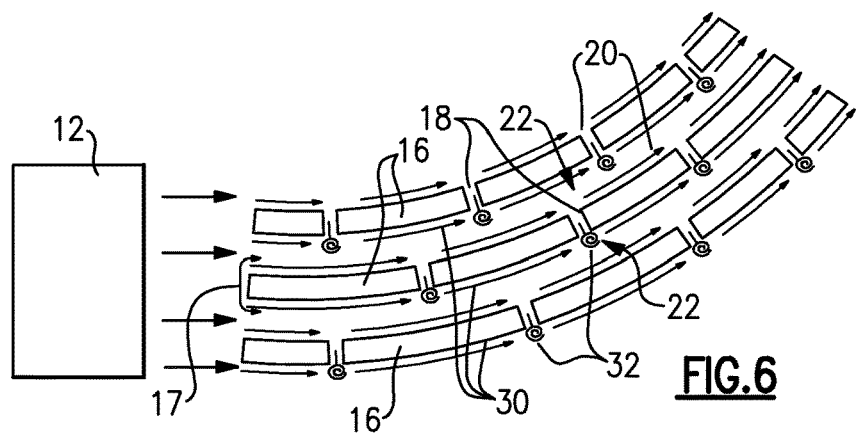
FIG. 6 is a schematic view of a plurality of curved fins and openings.

Referring to FIG. 6, with continued reference to FIGS. 2a, 2b, and 3, the fan 12 provides air to cool the curved fins 16 of the heat sink 14. The curved fins 16 define the curved channels 17 for air to flow in communication with the curved fins 16. A boundary layer, indicated by arrows 30, of air is generated along the surface of the curved fins 16. The relatively high temperature of the curved fins 16 causes air in the boundary layer 30 to have a temperature greater than air spaced further away from the fins 16. The pressure gradient across the fins 16 created by the shape of the curved fins 16, and resulting in the high pressure side 20 and the low pressure side 22, causes air to move through the holes 18 from the high pressure side 20 to the low pressure side 22. The air flow through the fins 16 creates jets 32 that disrupt the boundary layer 30 of air flow. The jets 32 created from movement of air through the holes 18 cause the higher temperature air in the boundary layer 30 to mix with the cooler air flow within the channels 17 to increase cooling.

Figure 7:
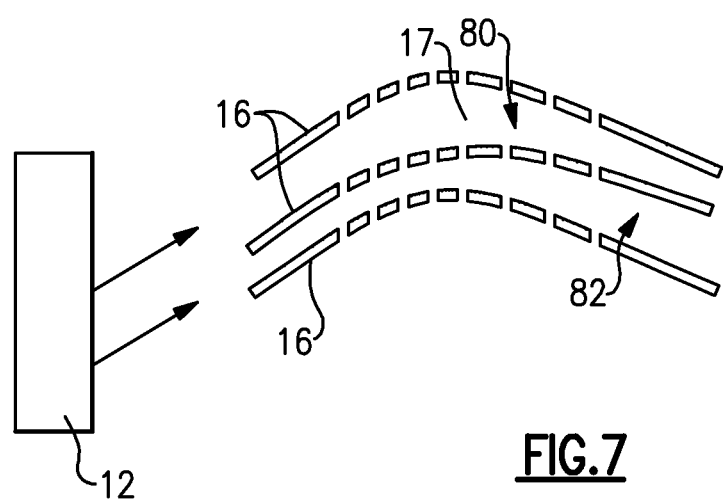
FIG. 7 is a schematic view of convergent and divergent curved channels.

Referring to FIG. 7, with continued reference to FIG. 6, the size and shape of the curved channels 17 as well as the curvature of the curved fins 16 may be adjusted to gain the greatest efficiency based on the needs of the cooling system 10. Further, these aspects may be adjusted to allow use with many different electrical components and electrical systems. When air flow from the fan 12 through the curved channels 17 accelerates, the pressure across the curved fins 16 drops. When air flow from the fan 12 through the curved channels 17 decelerates, the pressure increases. An example curved channel 17 can be a diverging curved channel 80, where the curved fins 16 defining the curved channel 17 move closer together to narrow a portion of the curved channel 17. Similarly, an example curved channel 17 can be a converging curved channel 82, where the curved fins 16 defining the curved channel 17 move further apart to widen a portion of the curved channel 17. A pressure difference is created to cause air to move through the openings 18 by arranging a diverging curved channel 80 and converging curved channel 82 to be adjacent.

An example system 10 moves portions of the curved fins 16 closer together results in smaller curved channels 17 with a greater pressure gradient due to higher fin surface area relative to channel volume ratios. The air flow being provided to the curved channels 17 remains the same, thus increased pressure results if curved channels 17 are moved closer together. The increased pressure provides for flexibility in the size and spacing of holes 18. Holes 18 with increased size produce a lower pressure gradient that can be counteracted by moving the curved channels 17 closer together. Similarly, if the holes 18 are reduced in size, the curved channels 17 can be moved farther apart to maintain a desired pressure gradient across the curved fins 16.

Figure 8:
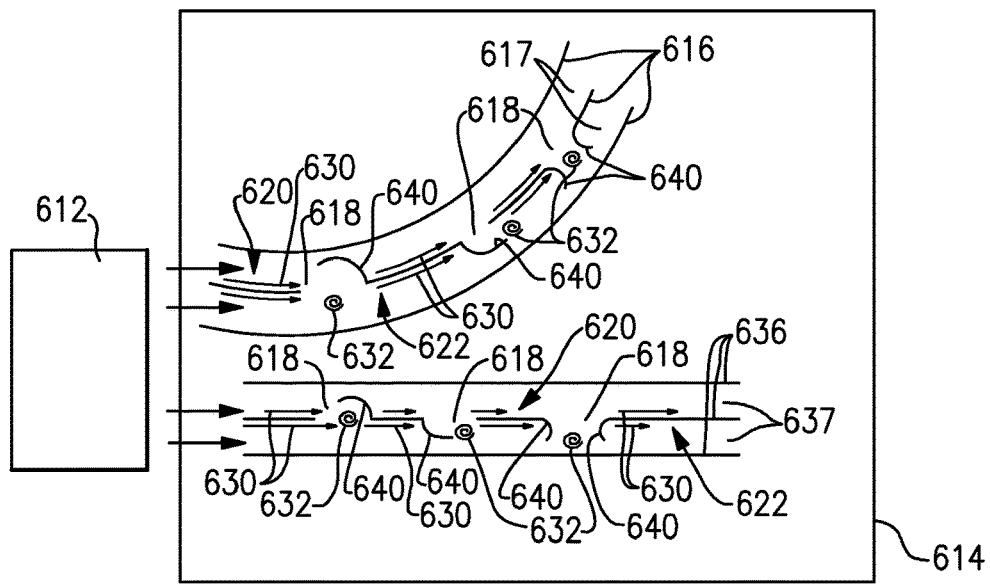
FIG. 8 is a schematic view of channels including protrusions.

Referring to FIG. 8, the fan 612 provides air to cool the fins 616, 636 of the heat sink 614. The fins may be curved fins 616 defining curved channels 617 or straight fins 636 define the linear channels 637 for air to flow in communication with the fins 616, 636. A boundary layer, indicated by arrows 630, of air is generated along the surface of the fins 616, 636. The relatively high temperature of the fins 616, 636 causes air in the boundary layer 630 to have a temperature greater than air spaced further away from the fins 616, 636. Protrusions 640 of the fins 616, 636 cause air to move through the openings 618 from a first side 620 to a second side 622. The air flow through the fins 616, 636 creates jets 632 that disrupt the boundary layer 630 of air flow. The jets 632 created from movement of air through the openings 618 cause the higher temperature air in the boundary layer 630 to mix with the cooler air flow within the channels 617, 637 to increase cooling. The protrusions 640 also disrupt the boundary layer 630 of air flow.

Figure 9A:
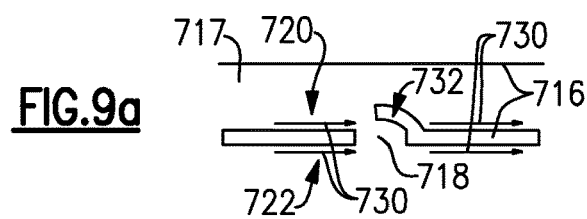
FIG. 9a is a sectional view of a fin with a protrusion that is a scoop.
Figure 9B:
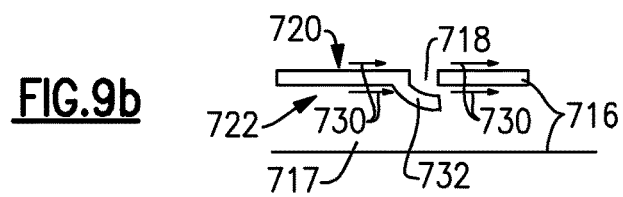
FIG. 9b is a second sectional view of a fin with a protrusion that is a scoop.

Referring to FIG. 9*a*, with continued reference to FIG. 8, an example fin 716 includes a protrusion that is a scoop 732. The scoop 732 extends away from the fin 716 into the channel 717. The scoop 732 is curved to move air flow in the boundary layer 730 of the first side 720 of the fin 716 through the opening 718 from a first side 720 of the fin 716 to a second side 722 of the fin 716. Alternatively, referring to FIG. 9*b*, with continued reference to FIG. 8, the scoop 732 extends away from the fin into the channel 717 on the second side 722. The scoop 732 is curved to disrupt air flow in the boundary layer 730 of the second side 722 of the fin 716 as well as aide air flow moving through an opening 718 further along the channel 717 on the second side 722 of the fin 716.

Figure 9C:
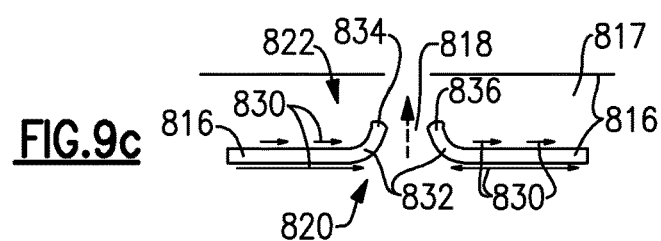
FIG. 9c is a sectional view of a fin with a protrusion that is a drawn hole.

Referring to FIG. 9*c*, with continued reference to FIG. 8, an example fin 816 includes a protrusion that is a drawn hole 832. The drawn hole 832 can be punched through the fin 816, or made in other known ways. The opening 818 is defined by a first end 834 and a second end 836 which are curved into the channel 817 such that they protrude into the channel 817. The opening 818 created by the ends 834, 836 allows air to flow from a first side 820 of the fin 816 to a second side 822 of the fin 816. The ends 834, 836 are also curved such that they disrupt air flow through the boundary layer 830 of the channel 817.

Figure 10:
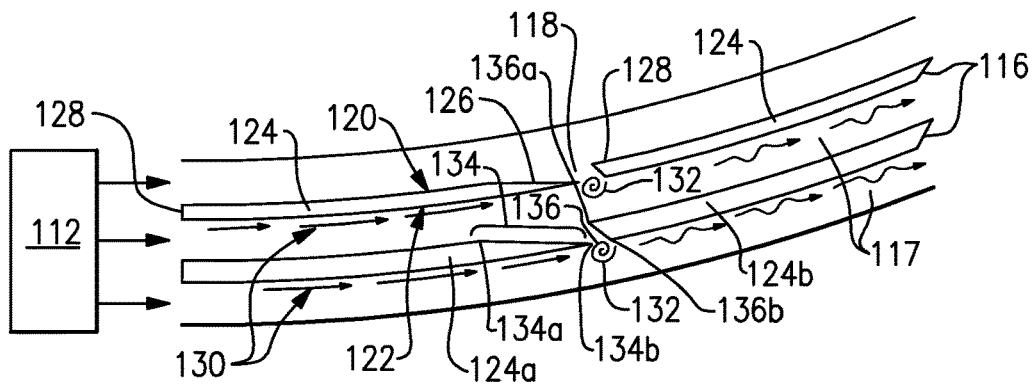
FIG. 10 is a schematic view of another example plurality of curved fins including of different sections.

Referring to FIG. 10, with continued reference to FIG. 6, another example curved fin 116 includes a number of sections 124. Openings 118 exist as the space between the sections 124, and communicate air from a high pressure side 120 to a low pressure side 122. The example curved fin sections 124 are aligned to maintain a desired curvature for generating the desired pressure gradient. Air flow through the openings 118 creates jets 132 which disrupt air in boundary layers 130. As a result of the jets 132, the air in the boundary layers 130 is forced away from the curved fins 116 and mixes with cooler air in the channels 117.

Each section 124 of the example curved fin 116 includes a trailing end 126 and a leading end 128. The trailing end 126 of a first section 124*a* forms an opening 118 with the leading end 128 of a second section 124*b*. The example trailing end 126 and leading end 128 are tapered to aide air flow through the opening 118. The trailing end 126 includes an inwardly decreasing edge from the high pressure side 120 to the low pressure side 122 creating a trailing edge 134. The trailing edge 134 begins at a first point 134*a* on the curved fin 116 and continues along the inwardly decreasing edge to the second point 134*b* on the curved fin 116 further towards the outer side 29 of the heat sink 14.

The leading end 128 includes an outwardly increasing edge from the high pressure side 120 to the low pressure side 122 creating a leading edge 136. The leading edge 136 begins at a first point 136*a* on the curved fin 116 and continues along the outwardly increasing edge to a second point 136*b* on the curved fin further towards the outer side 29 of the heat sink 14. When the openings 118 exist in the space between each trailing end 126 and leading end 128, they can be any height, including the entire height of the curved fin 116.

Figure 11:
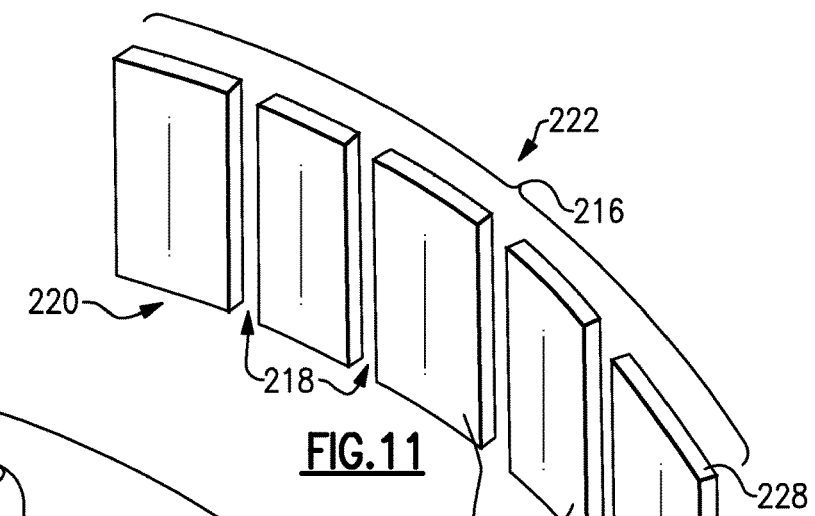
FIG. 11 is a sectional view of a plurality of slotted fin sections forming a curved fin.

Referring to FIG. 11, with continued reference to FIG. 6, the sections 224 forming the curved fin 216 are aligned to maintain a high pressure side 220 and a low pressure side 222 to create a pressure gradient. The pressure gradient drives air flow through slots 218 defined by the sections 224. In the disclosed example arrangement, the sections 224 are arranged to form a curved fin 216 and allow air to flow through the slots 218. The slots 218 extend from the bottom side 226 to the top side 228 of the curved fin 216; however, slots 218 of other lengths are within the contemplation of this disclosure.

Figure 12:
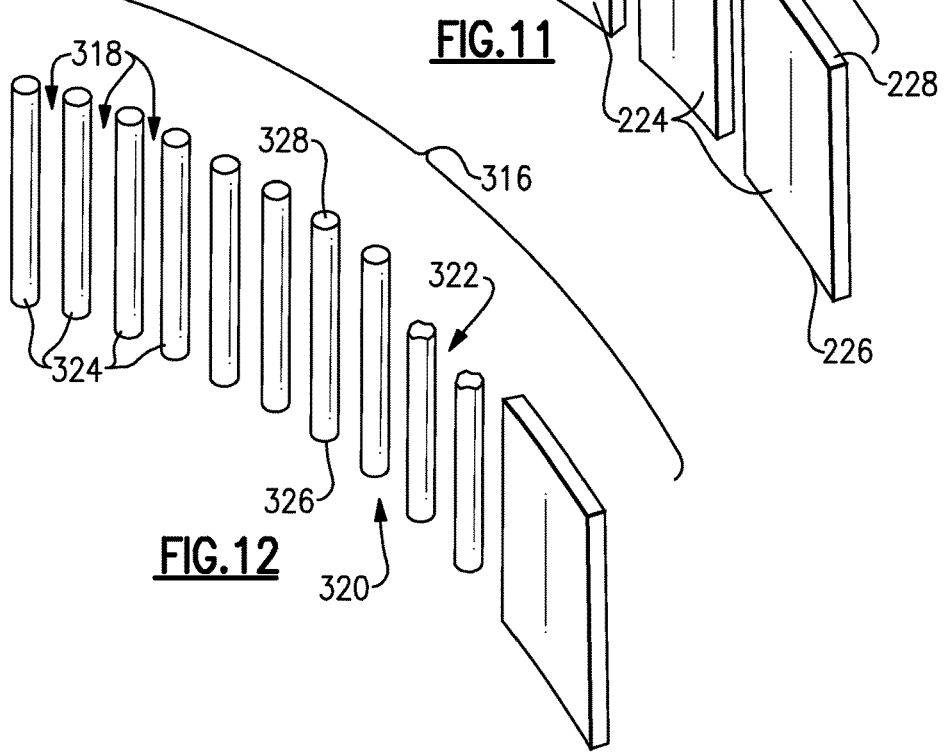
FIG. 12 is a sectional view of a plurality of pin fin sections forming a curved fin.

Referring to FIG. 12, with continued reference to FIG. 6, another example, curved fin 316 is shown. The example curved fin 316 includes a plurality of pin fins 324 arranged in the desired curved shape. The example curved fin 316 includes a low pressure side 320 and a high pressure side 322 creating a pressure gradient across the curved fin 316. The spaces between the pin fins 324 define openings 318 for air flow through the fin 316. The openings 318 may extend the entire height of the curved fin 316. The height of the openings 318 depends on the height of the curved fins 316 at particular placements along the curved fin 316. The height of the curved fins 316 is defined as the distance between the bottom side 326 and top side 328 of the curved fins 316. The curved fins 316 may be of varying height to provide openings 318 of varying sizes.

Referring to FIG. 13, another example curved fin 416 is shown. The curved fin 416 is thermally conductive material having a porous structure 402. The porous structure 402 provide for air to move through the fin 416. A high pressure side 420 and a low pressure side 422 exist to create a pressure gradient, causing air to flow through the porous structure 402 of the curved fin 416 from the high pressure side 420 to the low pressure side 422. The example porous structure 402 is a thermally conductive foam, such as carbon foam. It is within the contemplation of this example to utilize other porous materials that provide a desired air flow in response to generated pressure differential.

Figure 14:
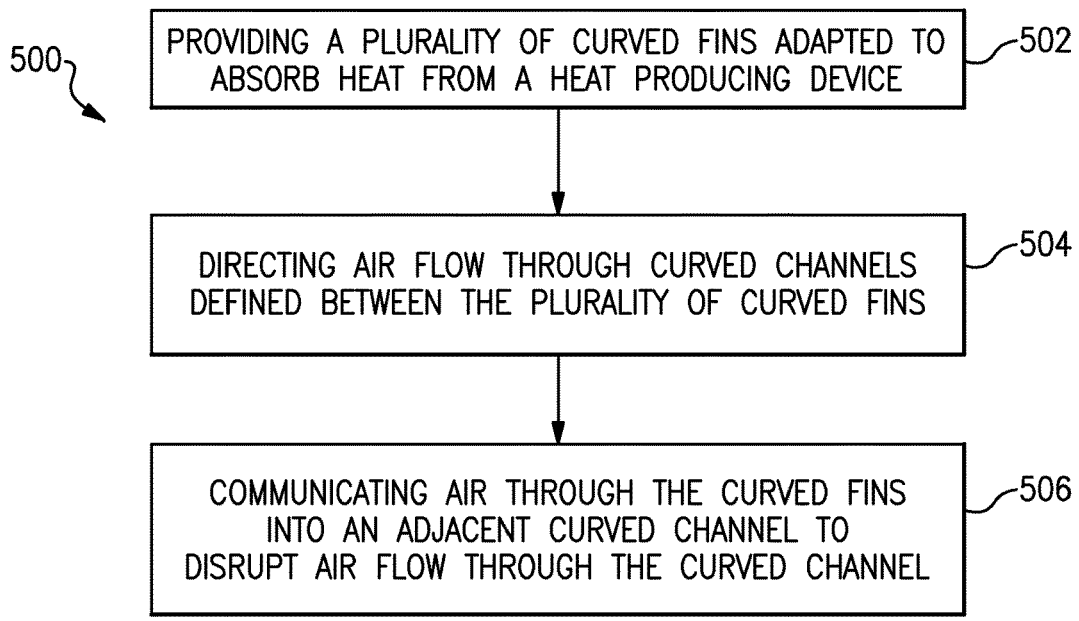
FIG. 14 is a method for cooling a system using a heat transfer device.

Referring to FIG. 14, an example method for cooling a heat producing device is schematically shown at 500 and includes the initial step of providing a plurality of curved fins adapted to absorb heat from the heat producing device as indicated at 502. The plurality of fins 16 define a plurality of curved channels 17. Air flow is created through the curved channels 17 as indicated at 504. The curved shape of the air flow channels 17 creates a pressure differential across each of the fins 16. Each of the plurality of fins 16 include openings through which air is drawn through the fin 16. Air from a high pressure side of the fin 16 is drawn through the fins 16 as indicated at 506. Air flowing through the fins 16 is expelled into the adjacent channel 17 to disrupt air flow as further indicated at 506 Disruption of air flow mixes hot air traveling along the surface of the fins 16 with cooler air flowing in a center portion of the channels 17. This mixes air flow providing improved heat transfer capability.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:
1. A heat transfer device comprising:
a base; and
a plurality of curved fins defining a corresponding plurality of curved air flow channels supported on the base, wherein the plurality of curved air flow channels define a non-linear path extending along a first surface of the base between a first position on the base and a second position on the base, each of the plurality of curved fins having a plurality of openings for communicating air flow from a high pressure side to a low pressure side to disrupt air flow through the corresponding curved air flow channel;

wherein at least one of the plurality of curved fins includes a plurality of spaced apart sections.

2. The heat transfer device of claim 1, wherein at least one opening is a hole in the curved fin.

3. The heat transfer device of claim 2, wherein the hole is tapered.

4. The heat transfer device of claim 1, wherein a first hole opening on the high pressure side is offset along the curved fin from a second hole opening on the low pressure side.

5. A heat transfer device comprising:
a base;
a plurality of curved fins defining a corresponding plurality of curved air flow channels supported on the base, wherein the plurality of curved air flow channels define a non-linear path extending along a first surface of the base between a first position on the base and a second position on the base, each of the plurality of curved fins having a plurality of openings for communicating air flow from a high pressure side to a low pressure side to disrupt air flow through the corresponding curved air flow channel; and
wherein at least two of the plurality of curved fins curve in opposite directions such that the high pressure sides of at least two of the plurality of curved fins face each other.

6. The heat transfer device of claim 1, wherein at least one of the plurality of spaced apart sections includes a tapered end.

7. The heat transfer device of claim 6, wherein each section is a pin fin.

8. The heat transfer device of claim 1, wherein the plurality of curved air flow channels include a convergent curved channel.

9. The heat transfer device of claim 1, wherein the plurality of curved air flow channel include a divergent curved channel.

10. The heat transfer device of claim 1, wherein the curved fin is formed of a porous material.

11. The heat transfer device of claim 1, wherein the heat transfer device is a radial heat sink.

12. The heat transfer device of claim 1, wherein the heat transfer device is a linear heat sink, such that ends of adjacent channels of the plurality of curved channels are linearly aligned.

13. The heat transfer device of claim 1, wherein the curved fins include a plurality of protrusions into at least one of the plurality of curved air flow channels.

14. The heat transfer device of claim 13, wherein the plurality of protrusions are at least one of a drawn hole or a scoop having an arcuate portion.

15. The heat transfer device of claim 5, wherein at least one of the plurality of curved fins includes a plurality of spaced apart sections.

16. The cooling system of claim 1, wherein the first side is a high pressure side and the second side is a low pressure side.

17. A heat transfer device comprising:
a plurality of fins defining a corresponding plurality of air flow channels, each of the plurality of fins having a plurality of openings for communicating air flow from a first side to a second side to disrupt air flow through the corresponding air flow channel, wherein the plurality of openings extend from the first side to the second side; and
a plurality of protrusions on the fin extending at least partially into the air flow channel, wherein the plurality of protrusions are a scoop having an arcuate portion, wherein the plurality of protrusions are adjacent a corresponding opening to disrupt air flow through the air flow channel, wherein the arcuate portion of at least one of the plurality of protrusions adjacent the corresponding opening is positioned relative to the opening and extends into the air flow channel such that air flow is directed into one of the plurality of openings.

18. The heat transfer device of claim 1, wherein the plurality of curved fins and the corresponding plurality of curved air flow channels are not uniformly curved, such that a first curved air flow channel of the plurality of curved air flow channels includes a first path and a second curved air flow channel of the plurality of curved air flow channels includes a second path, wherein the first path directs airflow in a different direction than the second path.

19. The heat transfer device of claim 1, wherein the first position is adjacent a central area of the base and the second position is an outer side of the base.

20. The heat transfer device of claim 3, wherein the hole is tapered from the high pressure side to the low pressure side of the curved fin.

21. The heat transfer device of claim 4, wherein the first hole opening and second hole opening define ends of the same opening.

22. The heat transfer device of claim 10, wherein the porous material is a carbon foam.

23. The heat transfer device of claim 17, wherein the plurality of protrusions extend into a high pressure side of the plurality of fins.

24. The heat transfer device of claim 17, wherein the plurality of fins are curved and the corresponding plurality of air flow channels are curved.

25. The heat transfer device of claim 5, wherein the high pressure sides of the two of the plurality of curved fins facing each other are convexly shaped.

26. A heat transfer device comprising:
a base;
a plurality of curved fins defining a corresponding plurality of curved air flow channels supported on the base, wherein the plurality of curved air flow channels define a non-linear path extending along a first surface of the base between a first position on the base and a second position on the base, each of the plurality of curved fins having a plurality of openings for communicating air flow from a high pressure side to a low pressure side to disrupt air flow through the corresponding curved air flow channel; and
wherein at least two of the plurality of curved fins curve in opposite directions such that the low pressure sides of at least two of the plurality of curved fins face each other.

27. The heat transfer device of claim 26, wherein the low pressure sides of the two of the plurality of curved fins facing each other are concavely shaped.

28. The heat transfer device of claim 3, wherein the hole includes a first diameter on a high pressure side greater than a second diameter on a low pressure side, wherein air flows from the high pressure side to the low pressure side.

29. The heat transfer device of claim 17, wherein at least one additional protrusion of the plurality of protrusions is on a low pressure side and is oriented relative to the opening to receive air flow from the opening such that the at least one additional protrusion directs air flow downstream in the channel relative to the corresponding opening.

30. The heat transfer device of claim 17, wherein the plurality of protrusions direct air flow away from one of the plurality of openings and disrupt air flow along a surface of the plurality of fins.

31. The heat transfer device of claim 17, wherein the plurality of fins is formed of a porous material.

32. The heat transfer device of claim 17, wherein the arcuate portion includes a surface, wherein the surface receives air flow and extends to the opening.

* * * * *